United States Patent [19]

Yahalom et al.

[11] Patent Number: 5,567,551
[45] Date of Patent: Oct. 22, 1996

[54] METHOD FOR PREPARATION OF MASK FOR ION BEAM LITHOGRAPHY

[75] Inventors: Joseph Yahalom, Haifa, Israel; Martin Peckerar, Silver Spring, Md.

[73] Assignee: The United States of America as represented by the Secretary of the Navy, Washington, D.C.

[21] Appl. No.: 222,791

[22] Filed: Apr. 4, 1994

[51] Int. Cl.⁶ ........................................................ G03F 9/00
[52] U.S. Cl. .............................. 430/5; 430/296; 430/313; 430/394; 430/396; 216/12
[58] Field of Search ................................ 430/5, 296, 319, 430/313, 314, 394, 396; 156/643; 378/34, 35

[56] References Cited

U.S. PATENT DOCUMENTS

| | | |
|---|---|---|
| 4,022,927 | 5/1977 | Pfeiffer et al. ............................ 430/323 |
| 4,101,782 | 7/1978 | Seliger ...................................... 430/319 |
| 5,057,388 | 10/1991 | Yahalom . |
| 5,096,791 | 3/1992 | Yahalom . |

Primary Examiner—S. Rosasco
Attorney, Agent, or Firm—Thomas E. McDonnell; Barry A. Edelberg

[57] ABSTRACT

A mask for ion beam lithography is made by coating a front side, sidewalls, and a backside of a substrate with an insulating layer; opening, on the front side of the substrate, a window in the insulating layer to expose a front substrate surface; depositing an oxide membrane on the front substrate surface; opening a portion of the insulating material on the backside of the substrate to form an exposed backside of the substrate; forming a photoresist layer on the oxide membrane; patterning the photoresist layer; ion beam etching the oxide membrane through the patterned photoresist layer to completely remove selected portions of the oxide membrane and form a stenciled pattern in the oxide membrane; removing the patterned photoresist layer from the stenciled oxide membrane; removing, from the backside of the substrate, the exposed backside of the substrate to expose a backside of the stenciled pattern in the oxide membrane, thus leaving a stenciled oxide membrane, corresponding to the stenciled oxide pattern, held within a frame formed by remaining portions of the substrate. The stenciled oxide membrane is capable of being supported entirely by the frame.

21 Claims, 2 Drawing Sheets

METHOD FOR PREPARATION OF MASK FOR ION BEAM LITHOGRAPHY

The present invention relates to ion beam lithography. More particularly, the invention relates to an improved mask for ion beam lithography and a method for the manufacture thereof.

BACKGROUND OF THE INVENTION

Ion beam lithography has become an important tool in microelectronics when such circuits are required. In our previous Israeli Patent Number 88837, a method for the manufacture of an improved X-ray lithography mask was disclosed. According to this method a sequence of the following steps is involved:

(a) protection of the edges of a substrate;

(b) deposition of a continuous compact oxide layer over the non-protected portion of the front side of said surface;

(c) etching the backside of the substrate, obtaining an oxide membrane supported on the substrate, and (d) obtaining a pattern delineation of said membrane.

The use of ion charge particles is an alternative advanced microlithography approach. The ion beam imaging combines several inherent advantages: high resolution beams, a possibility to influence its path by a magnetic field, a very low energy scatter and high energy levels of up to 150 keV. A main advantage of using ion beams over electron beams is the lack of backscattered and hence minimum proximity effect.

A problem which exists in masked ion beam lithography, is a result of the pattern-dependent thermally induced distortions. The energy of the beam being absorbed in the mask will result in its heating. For high-resolution lithography, this will effectively decrease the throughput by limiting the beam current density.

In a review by D. J. Elliot (Integrated Circuit fabrication technology, p. 276–281, McGraw-Hill Publishing Company, 1989), a membrane mask is used, having a thin membrane to self-support the pattern. Either a thin amorphous membrane, sufficiently transparent for the ions, or a channelling film of crystalline silicon are suggested for this use. In both cases, the membrane supports an ion-absorbing layer of gold. The ions are scattered in the amorphous membrane and this will degrade the overall performance.

The main problem encountered in the method for the manufacture of an ion beam mask, relates to the production of a thin and strong membrane capable to withstand dimensional stability and providing accuracy of the absorber pattern. This problem is solved by using a silicon membrane and exposing the resist in the channeling direction. However, residual scattering of ions in the mask membrane still exists even in the channeling of silicon membrane. This disadvantage is completely eliminated in an open-stencil mask, wherein a thin membrane with transmission holes is etched through the entire membrane thickness. A grid is provided as a support, consisting of a matrix of small transmission holes instead of completely open transmission areas. In this manner, most of the pattern restrictions associated with the stencil masks are eliminated. However, this grid increases significantly the mask area from which scattered ions may escape; furthermore, this type of mask will require a higher fluence to accomplish an exposure than simple stencil masks.

It is an object of the present invention to provide an improved ion beam lithography mask and a simple method for the manufacture thereof. It is another object of the present invention to provide an improved ion beam lithography mask which is highly stable, being substantially free of any stresses encountered in such known masks.

BRIEF DESCRIPTION OF THE INVENTION

The invention consists of a method for the manufacture of an improved mask for ion beam lithography, comprising the steps of: (a) coating a substrate by an insulating layer; (b) opening a window on the front side of the substrate; (c) depositing an oxide layer on the front side of the substrate; (d) opening a portion of the insulating layer; (e) patterning the oxide layer by ion beam photoresist and etching techniques, and (f) removal of a portion of the substrate from the backside, thus leaving a stenciled oxide mask resting on the substrate frame. The mask produced is characterized by its durability, ensuring a membrane flatness and siffness capable to prevent any feature displacement during its use.

DETAILED DESCRIPTION OF THE INVENTION AND FIGURES

Membranes are usually supported on a more massive ring to ensure structural strength. It is important to have a close match between the thermal expansion coefficients of the ring and the membrane. As known, a film with a high elastic modulus is necessary to minimize local distortions of the pattern due to stresses. Low residual stresses are most desirable in order to avoid distortion of the membrane after a portion of it is removed to make a stencil.

The main properties required for a material to be useful as a membrane are: Young modulus and coefficient of thermal expansion. Most preferred materials are silicon, alumina and gold possessing the following main properties:

| The material | Thermal expansion ($°C.^{-1}$) | Young Modulus ($GP^a$) |
|---|---|---|
| Silica | $2.6 \times 10^{-6}$ | 162 |
| Alumina | $9 \times 10^{-6}$ | 373 |
| Gold | $14 \times 10^{-6}$ | 786 |

Aluminiun oxide exhibits a most interesting combination of thermal and mechanical properties: its thermal coefficient of expansion is between those of silica and gold and its Young's modulus is high. Finally, alumina exhibits an extremely low etch rate in ion beam milling. This last property is of great significance for ion projection lithography since it indicates extremely good durability in ion beams.

Figure 1:
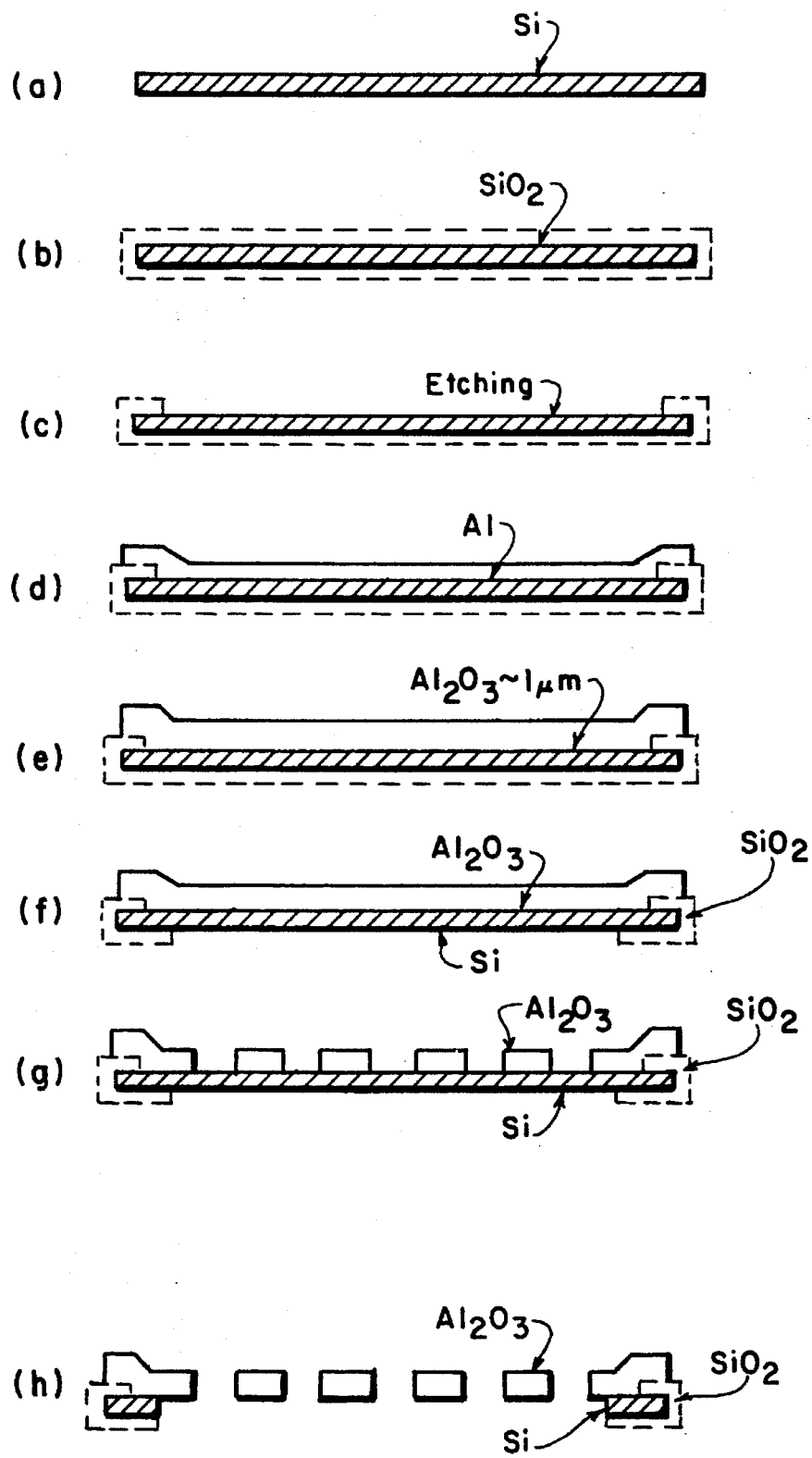

The attached FIG. 1, illustrates in a schematic manner a first embodiment according to the present invention. The wafer used in step (a) as a substrate, is preferably silicon and provides the frame of the mask. Of course, other materials such as copper may also be considered as substrate.

In the second step (b), this substrate is coated with an insulating layer in order to open a window on the front side. Examples of materials suitable for this insulating are: waxes, lacquers, photoresists and most preferred are thermally grown silica, which are etched to form a window for the membrane. This layer in the third step (c). In the fourth step (d), a metal layer is then deposited on the front side of the substrate either by electron-beam evaporation or sputtering. This layer is selected from aluminium, titanium, silicon and zirconium. Aluminium is the most preferred due to its thermal and mechanical properties. Particularly, the alumina films which are formed are characterized by the following beneficial properties: are strong, exhibits a high elastic modulus, have the required minimal tensile strength, exhibits little scattering and can withstand high ion fluences. A further important advantage of alumina is the optical transparency which allows an easy alignment and low residual stresses. However, a slight tensile strength is required in order to keep the membrane flat. A most preferred method for obtaining the metal oxide layer is by a complete anodization of the front side of the substrate (e).

In the sixth step (f) a portion of the insulating material on the backside of the substrate is opened in order to obtain a window.

In the seventh step (g), the oxide layer is patterned by ion beam photoresist and etching techniques.

In the last step (h) a portion of the substrate from the backside is removed by a selective etching reagent thus leaving an open-stencil alumina mask. A preferred reagent for this purpose is boiling hydrazine which does attack only silicon, but not the alumina or silicon oxide.

Figure 2:
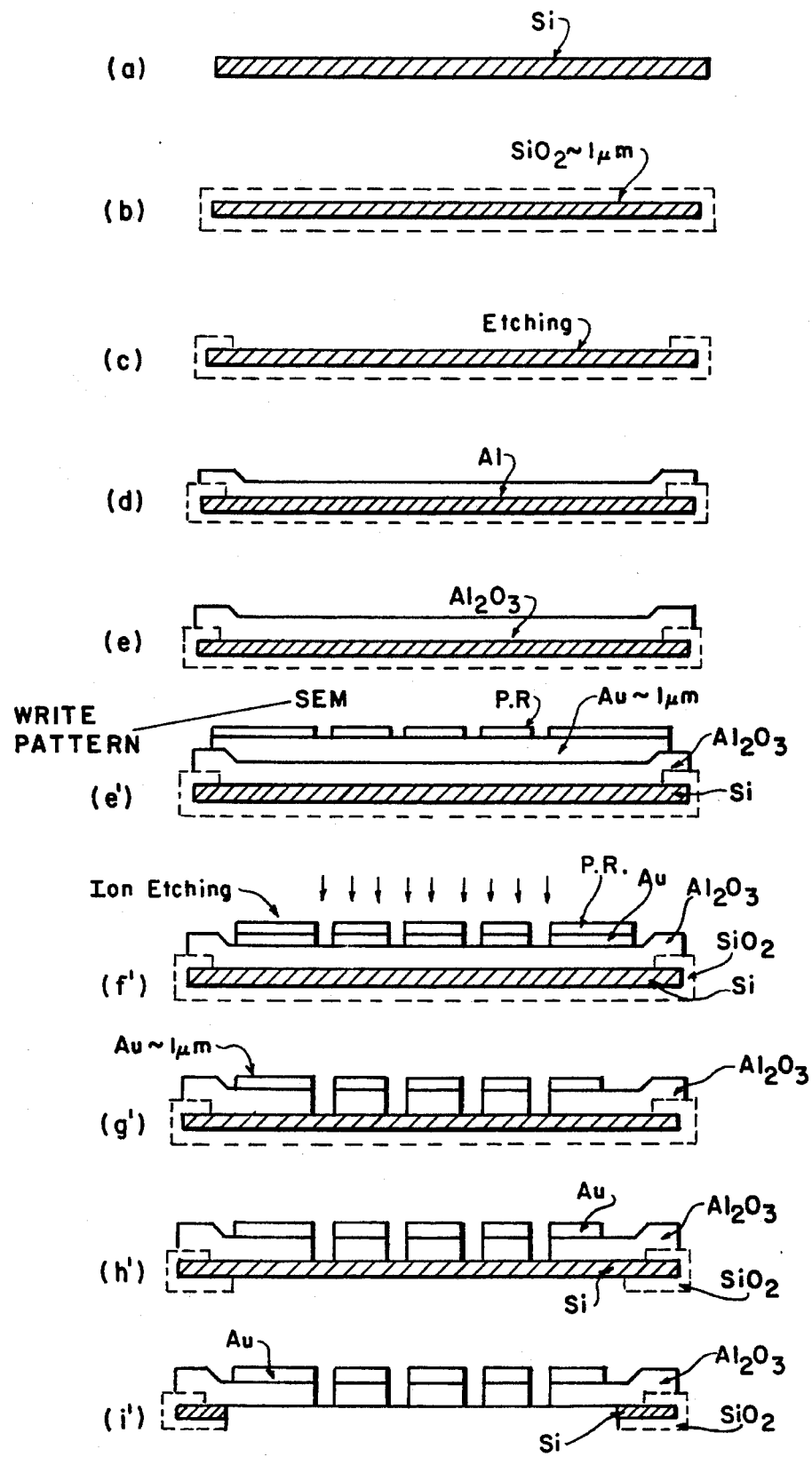

According to another embodiment according to the present invention, the ion beam mask is provided with a gold absorber. This was found to be most useful in case of a stronger beam, obtaining a better absorption than without the gold presence. The thickness of the gold layer should be in the range of 0.1 to 5μ and most preferably in the range of between 0.5 to 3.5μ. According to this embodiment, as illustrated in FIG. 2, the mask comprises the four steps as described above followed by the following additional steps:

(e') A thin layer of gold is spread onto the anodized layer using an adhesive medium such as evaporated titanium. According to a most preferred embodiment the gold spreading is carried out by sputtering which will avoid the requirement of the evaporated titanium. A photoresist is applied and the electron beam technology may be applied in order to obtain submicron dimensions.

(f') The gold is etched in a dry medium, using an ion beam milling in an argon environment. The dry etching is preferred since it will reduce undercutting and would retain the submicron features.

(g') The patterned gold and membrane is attached by a reactive ion etching, thus forming a stencil pattern in the alumina, while the silica at the backside is etched in order to form the ring (h').

In the last step (i'), the exposed silicon is selectively etched, using a known enchant, such as hydrazine, thus leaving an alumina-gold stencil mask.

In order to provide a uniform etching, the ion beam that dislodge the atoms of the incident solid, must have a substantially uniform density, being of the same wavelength of energy. In the etching chamber, the pressure should be low enough in order to prevent beam scattering and back sputtering.

The ion beam mask produced according to the present invention, may be considered as a non-optical alternative to obtain submicron images without moving to electron-beam imaging.

While the invention has been described with reference to some particular embodiments, those skilled in the art will recognize that minor changes can be made in form and detail without departing from the spirit and scope of the invention as covered by the appended claims.

We claim:

1. A method for obtaining a mask for ion beam lithography comprising the steps of:

coating a front side, sidewalls, and a backside of a substrate with an insulating layer;

opening, on the front side of the substrate, a window in the insulating layer to expose a front substrate surface;

depositing an oxide membrane on the front substrate surface;

opening a portion of the insulating material on the backside of the substrate to form an exposed backside of the substrate;

forming a photoresist layer on said oxide membrane;

patterning said photoresist layer;

ion beam etching said oxide membrane through said patterned photoresist layer to completely remove selected portions of said oxide membrane, thereby forming a stenciled pattern in said oxide membrane;

removing said patterned photoresist layer from said stenciled oxide membrane;

removing, from the backside of the substrate, the exposed backside of the substrate to expose a backside of said stenciled pattern in said oxide membrane, thus leaving a stenciled oxide membrane, corresponding to said stenciled oxide pattern, held within a frame formed by remaining portions of said substrate, said stenciled oxide membrane being capable of being supported entirely by said frame.

2. The method according to claim 1, wherein said substrate is selected from the group consisting of silicon and copper.

3. The method according to claim 1, wherein said substrate has a diameter of 1 to 12 inches.

4. The method according to claim 1, wherein the insulating material is selected from the group consisting of thermally grown silica, waxes, lacquers and photoresist.

5. The method acceding to claim 1, wherein the oxide membrane deposited on the front side of the substrate is obtained by sputtering.

6. The method according to claim 1, wherein said oxide membrane is deposited by a complete anodization of the front side of the metal of the substrate.

7. The method according to claim 1, wherein the removal of said substrate from the backside of said substrate is performed using hydrazine as a selective etchant.

8. The mask for ion beam lithography produced according to the method of claim 1.

9. The method of claim 1, wherein said stenciled oxide membrane is supported entirely by said frame.

10. The method of claim 1, wherein said oxide membrane is alumina.

11. A method for obtaining a mask for ion beam lithography comprising the steps of:

coating a front side, sidewalls, and a backside of a substrate with an insulating layer;

opening, on a front side of the substrate, a window the insulating layer to expose a front substrate surface;

depositing an oxide membrane on the front substrate surface;

spreading a thin layer of gold onto the oxide membrane, said thin layer of gold having a thickness of about 0.1 μm to about 5 μm;

forming a photoresist layer on said thin layer of gold;

patterning said photoresist layer;

etching said thin layer of gold, through said photoresist, in a dry medium, using an ion beam milling in an inert environment, thus forming a patterned gold layer;

reactive ion etching said oxide membrane through said patterned photoresist layer and said patterned gold layer to completely remove selected portions of said oxide membrane not covered by said patterned gold layer, thereby forming a stenciled pattern in said oxide membrane and said patterned gold layer;

removing said patterned photoresist layer from said stenciled oxide membrane;

selectively etching a portion of the insulating layer from the backside of said substrate to form an exposed backside of said substrate; and selectively etching, from the backside of the substrate, said exposed backside of said substrate to expose a backside of said stenciled pattern, thus leaving a stenciled oxide-gold mask corresponding to said stenciled pattern, said stenciled oxide-gold mask consisting of said oxide membrane, said thin gold layer, and any adhesive medium therebetween, held within a frame formed by remaining portions of said substrate, said stenciled oxide-gold mask being capable of being supported entirely by said frame.

12. The method according to claim 11, wherein the thin layer of gold is spread by sputtering.

13. The method according to claim 11, wherein said selective etching of said backside of said substrate is performed using a solution of hydrazine as a selective etchant.

14. The mask for ion beam lithography made according to the method of claim 11.

15. The method of claim 11, wherein said step of selectively etching a portion of the substrate from the backside of said substrate includes the step of removing a central portion of said the substrate from the backside thereof except for a supportive frame surrounding the etched portion, thereby obtaining said stenciled oxide-gold mask, corresponding to said stenciled pattern supported at its periphery by said frame.

16. The method of claim 11, wherein said stenciled oxide-gold mask is supported entirely by said frame.

17. The method of claim 11, wherein said oxide membrane is alumina.

18. A method for obtaining a mask for ion beam lithography comprising the steps of:

coating a front side, sidewalls, and a backside of a substrate with an insulating layer;

opening, on the front side of the substrate, a window in the insulating layer to expose a front substrate surface;

depositing an oxide membrane on the front substrate surface;

opening a portion of the insulating material on the backside of the substrate to form an exposed as backside of the substrate;

patterning the oxide by photolithography and etching, thereby forming a stenciled pattern in said oxide membrane;

removing the exposed backside of the substrate to expose a backside of said stenciled pattern in said oxide membrane, thus leaving a stenciled oxide membrane, corresponding to said stenciled oxide pattern, held within a frame formed by remaining portions of said substrate, said stenciled oxide membrane being capable of being supported entirely by said frame.

19. The method of claim 1, wherein step of removing the exposed backside of the substrate includes the step of removing a central portion of the substrate from the backside thereof except for a supportive frame surrounding the etched portion, thereby obtaining said stenciled oxide mask supported at its periphery by said frame.

20. The method of claim 18, wherein said stenciled oxide membrane is supported entirely by said frame.

21. The method of claim 18, wherein said oxide membrane is alumina.

* * * * *